United States Patent
Trimberger

(10) Patent No.: US 8,427,193 B1
(45) Date of Patent: Apr. 23, 2013

(54) INTELLECTUAL PROPERTY CORE PROTECTION FOR INTEGRATED CIRCUITS

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/962,566

(22) Filed: Dec. 7, 2010

(51) Int. Cl.
*H03K 19/00* (2006.01)

(52) U.S. Cl.
USPC ............................................. 326/8; 326/38

(58) Field of Classification Search .................. None
See application file for complete search history.

(56) References Cited

U.S. PATENT DOCUMENTS

| | | |
|---|---|---|
| 4,203,070 A | 5/1980 | Bowles et al. |
| 4,754,216 A | 6/1988 | Wong |
| 4,810,975 A | 3/1989 | Dias |
| 4,897,652 A | 1/1990 | Leon |
| 5,007,087 A | 4/1991 | Bernstein et al. |
| 5,276,734 A | 1/1994 | Hashimoto |
| 5,450,360 A | 9/1995 | Sato |
| 5,523,746 A | 6/1996 | Gallagher |
| 5,787,012 A | 7/1998 | Levitt |
| 5,828,678 A | 10/1998 | Mock |
| 5,838,256 A | 11/1998 | Pearson et al. |
| 5,907,298 A | 5/1999 | Kiriyama et al. |
| 5,952,933 A | 9/1999 | Issa et al. |
| 5,961,577 A | 10/1999 | Soenen et al. |
| 5,963,043 A | 10/1999 | Nassif |
| 5,964,881 A | 10/1999 | Thor |
| 5,970,142 A | 10/1999 | Erickson |
| 6,002,991 A | 12/1999 | Conn |
| 6,005,829 A | 12/1999 | Conn |
| 6,101,624 A | 8/2000 | Cheng et al. |
| 6,150,837 A | 11/2000 | Beal et al. |
| 6,161,213 A | 12/2000 | Lofstrom |
| 6,185,126 B1 | 2/2001 | Rodgers et al. |
| 6,215,874 B1 | 4/2001 | Borza et al. |
| 6,230,270 B1 | 5/2001 | Laczko, Sr. |
| 6,233,339 B1 | 5/2001 | Kawano et al. |
| 6,260,146 B1 | 7/2001 | Mos et al. |
| 6,298,453 B1 | 10/2001 | Culbertson et al. |
| 6,351,814 B1 | 2/2002 | Batinic et al. |
| 6,356,637 B1 | 3/2002 | Garnett |
| 6,587,978 B1 | 7/2003 | Merritt et al. |
| 6,604,214 B1 | 8/2003 | Fukushima |
| 6,741,900 B2 | 5/2004 | Tamura et al. |
| 6,791,353 B1 | 9/2004 | Beal et al. |
| 6,816,825 B1 | 11/2004 | Ashar et al. |

(Continued)

OTHER PUBLICATIONS

U.S. Appl. No. 13/082,271, filed Apr. 7, 2011, Trimberger.

(Continued)

*Primary Examiner* — Crystal L Hammond
(74) *Attorney, Agent, or Firm* — Kevin T. Cuenot

(57) ABSTRACT

A method of using an integrated circuit (IC) can include reading a device code from a selected IC, calculating a measure of randomness from a plurality of values specified within the device code, and comparing the measure of randomness to a randomness criterion. A determination can be made as to whether the selected IC is compromised according to the comparison. An intellectual property (IP) protection method can include determining a list of controlled IP cores within a bitstream specifying a circuit design, creating a bitstream identifier within the bitstream that is associated with the list of controlled IP cores, and determining a count specifying a number of integrated circuits loaded with the bitstream.

15 Claims, 6 Drawing Sheets

U.S. PATENT DOCUMENTS

| | | | |
|---|---|---|---|
| 6,823,069 | B1 | 11/2004 | KItajima et al. |
| 6,931,543 | B1 | 8/2005 | Pang et al. |
| 6,978,397 | B2 | 12/2005 | Chan |
| 7,191,339 | B1 | 3/2007 | Trimberger |
| 7,200,235 | B1 | 4/2007 | Trimberger |
| 7,240,218 | B2 | 7/2007 | Kean |
| 7,299,325 | B1 | 11/2007 | Waterhouse et al. |
| 7,380,131 | B1 | 5/2008 | Trimberger |
| 7,565,541 | B1 | 7/2009 | Tarbouriech |
| 7,734,643 | B1 | 6/2010 | Waterhouse et al. |
| 8,176,072 | B2 | 5/2012 | Jayakody et al. |
| 8,218,859 | B2 | 7/2012 | Wang et al. |
| 2001/0032318 | A1 | 10/2001 | Yip et al. |
| 2002/0018561 | A1 | 2/2002 | Emelko |
| 2008/0270805 | A1* | 10/2008 | Kean .................... 713/189 |
| 2009/0303044 | A1 | 12/2009 | Furuichi et al. |
| 2010/0044438 | A1 | 2/2010 | Chen et al. |
| 2012/0158790 | A1 | 6/2012 | Chowdhury |

OTHER PUBLICATIONS

U.S. Appl. No. 12/876,825, filed Sep. 7, 2010, Trimberger.
U.S. Appl. No. 11/101,076, filed Apr. 7, 2005, Trimberger.
U.S. Appl. No. 11/151,985, filed Jun. 14, 2005, Trimberger.
U.S. Appl. No. 12/961,753, filed Dec. 7, 2010, Trimberger.
U.S. Appl. No. 12/961,770, filed Dec. 7, 2010, Trimberger.
Ajluni, Cheryl, "Give Your IP a Unique ID With Silicon Fingerprinting," *Electronic Design*, Feb. 7, 2000, pp. 1-2, Penton Media, Inc., New York, New York, USA.
Eastlake, D. et al., "Randomness Recommendations for Security," Dec. 1994, RFC 1750, downloaded Jan. 27, 2005 from www.faqs.org/rfcs/rfc1750.html, pp. 1-24.
IBM Corporation, "Integrated Circuit Compatible Random Number Generator," IBM Technical Disclosure Bulletin, TBD-ACC-No: NN8804333, Apr. 1, 1998, vol. 1, Issue No. 11, pp. 333-335.
Intrinsic-ID, Inc., "Quiddikey," downloaded Sep. 15, 2010 from www.intrinsic-id.com/products, Intrinsic-ID, Inc., San Jose, California, USA.
Suh, G. Edward et al., "Physical Unclonable Functions for Device Authentication and Secret Key Generation," *Proc. of the 44$^{th}$ ACM/IEEE Design Automation Conference*, Jun. 4, 2007, pp. 9-14, ACM, New York, New York, USA.
Xilinx, Inc., *The Programmable Logic Data Book 1998*, (v1.4), Chapter 4, Nov. 10, 1997, pp. 4-1 to 4-374, Xilinx, Inc., San Jose, California, USA.
Xilinx, Inc., *Using Look-Up Tables as Shift Registers (SRL16) in Spartan-3 Generation FPGAs*, XAPP465 (v1.1), May 20, 2005, pp. 1-17, Xilinx, Inc., San Jose, California, USA.

* cited by examiner

INTELLECTUAL PROPERTY CORE PROTECTION FOR INTEGRATED CIRCUITS

FIELD OF THE INVENTION

One or more embodiments disclosed within this specification relate to integrated circuits (ICs). More particularly, one or more embodiments relate to protecting intellectual property incorporated into circuit designs implemented within ICs.

BACKGROUND

Programmable integrated circuits (ICs) are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

Generally, an intellectual property (IP) core refers to a pre-designed, programmatic description of hardware that performs a particular function. The IP core can be specified as a hardware description language file or files, as a bitstream that programs a programmable IC, whether fully or partially programmable, as a netlist, or the like. In another example, an IP core can include source code or schematics that describe the logic and connectivity of a portion of a circuit design.

Due to the complexity of modern circuit designs and the availability of IP cores from many different providers, IP cores from one or more different providers can be included within a circuit design for an IC. In consequence, tracking usage of IP cores to ensure that the IP cores are adequately protected from piracy and ensuring that the provider of each IP core is adequately compensated for use of the IP core has become an important concern.

SUMMARY

One or more embodiments disclosed within this specification relate to integrated circuits (ICs) and, more particularly, to protecting intellectual property (IP) incorporated into circuit designs implemented within ICs. One or more embodiments can include a method of using an IC. The method can include reading a device code from a selected IC, and calculating, using a processor, a measure of randomness from a plurality of values specified within the device code. The method further can include comparing the measure of randomness to a randomness criterion, and determining whether the selected IC is compromised according to the comparison.

One or more other embodiments can include a method of IP protection. The method can include determining, using a processor, a list of controlled IP cores within a bitstream specifying a circuit design and creating a bitstream identifier within the bitstream. The bitstream identifier can be associated with the list of controlled IP cores. The method also can include determining a count specifying a number of ICs loaded with the bitstream, and determining usage of each controlled IP core on the list according to the count and the list of controlled IP cores using the bitstream identifier.

One or more other embodiments can include an integrated circuit. The integrated circuit can include a first circuit block specified by a controlled IP core and a security circuit block. The security circuit block can be configured to enable the first circuit block responsive to receiving a key upon startup of the integrated circuit that matches an internal key, and disable the first circuit block responsive to receiving a key upon startup of the integrated circuit that does not match the internal key. The key can depend upon a device code that uniquely identifies the IC and a bitstream identifier that specifies the controlled IP core.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to protecting intellectual property (IP) incorporated into circuit designs implemented within ICs. In accordance with the inventive arrangements disclosed within this specification, usage of IP cores within circuit designs can be tracked. The IP cores used within a given circuit design can be correlated with that circuit design. The number of ICs within which the circuit design is implemented further can be tracked thereby allowing the usage of individual IP cores to be monitored.

One or more embodiments disclosed herein further provide techniques for determining whether a particular IC has been compromised. Typically, each IC includes some form of a device code. The device code, in general, can be viewed as a form of fingerprint that can uniquely identify the particular IC from which the device code is extracted. The device code can be used for various purposes including, for example, tracking usage of IP cores, counting the number of ICs within which a given circuit design has been implemented, and selectively enabling IP cores within an IC. In accordance with the inventive arrangements disclosed herein, techniques for determining whether the device code has been tampered with also are provided.

Figure 1:
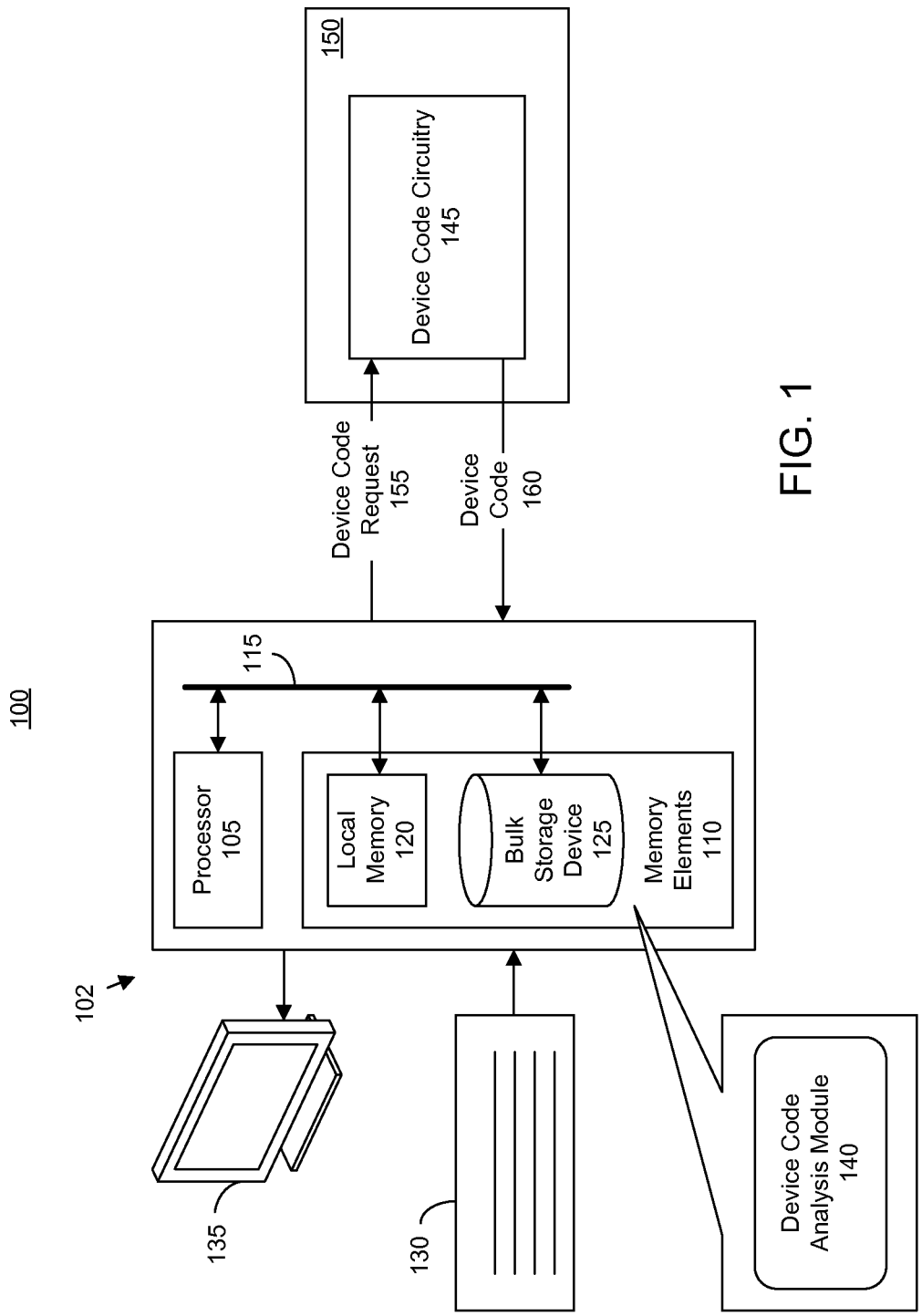
FIG. 1 is a first block diagram illustrating a system for evaluating device codes from an integrated circuit in accordance with one or more embodiments disclosed within this specification.

FIG. 1 is a first block diagram illustrating a system 100 for evaluating device codes from an IC in accordance with one or more embodiments disclosed within this specification. System 100 can include a data processing system 102 coupled to an IC 150. For example, IC 150 can be located within a larger system, a circuit board, an IC programming system, or the like, that can be coupled to data processing system 102.

Data processing system 102 can include at least one processor 105 coupled to memory elements 110 through a system bus 115. As such, data processing system 102 can store program code within memory elements 110. Processor 105 can execute the program code accessed from memory elements 110 via system bus 115. In one or more embodiments, for example, data processing system 102 can be implemented as a computer that is suitable for storing and/or executing program code. In one or more other embodiments, system 102 can be implemented as an IC programmer. It should be appreciated, however, that data processing system 102 can be implemented in the form of any system including a processor and memory that is capable of performing the functions described within this specification.

Memory elements 110 can include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard drive or other persistent data storage device. Data processing system 102 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device (not shown) optionally can be coupled to data processing system 102. The I/O devices can be coupled to data processing system 102 either directly or through intervening I/O controllers. Network adapters also can be coupled to data processing system 102 to enable data processing system 102 to become coupled to other systems, computer systems, remote printers, and/or remote storage devices through intervening private or public networks. Modems, cable modems, and Ethernet cards are examples of different types of network adapters that can be used with data processing system 102.

As pictured in FIG. 1, memory elements 110 can store a device code analysis module (DCAM) 140. DCAM 140, being implemented in the form of executable program code, can be executed by data processing system 102 and, more particularly, by processor 105. In general, by executing DCAM 140, data processing system 102, and thus, processor 105, can issue one or more device code requests 155 to IC 150.

IC 150 can be implemented in the form of any of a variety of different IC types. For example, IC 150 can be implemented as a non-programmable IC. In another example, IC 150 can be implemented as a programmable IC. IC 150 can include device code circuitry 145. In one or more embodiments, device code circuitry 145 can be implemented using one or more circuit blocks within IC 150. In general, device code circuitry 145 can output a device code 160 in response to device code request 155.

In one or more embodiments, a "device code" can be a predetermined code that is permanently fixed within IC 150. For example, device code 160 can be a serial number that is unique to IC 150 and that is permanently written to, or burned into, a location within IC 150 that can be read out from IC 150 by device code circuitry 145. In one or more other embodiments, a "device code" can be a randomly generated number. Accordingly, device code circuitry 145 can represent a random number generator implemented within IC 150 that, responsive to device code request 155, generates and outputs device code 160 in the form of a random number. A random device code may be used for any of a variety of different purposes including, but not limited to, serving as a nonce or a random initialization string for a cryptographic protocol.

In one or more other embodiments, a "device code" can be a physically unclonable function (PUF). A PUF refers to a function that is embodied in a physical structure. The performance of the physical structure, as measured by some selected metric reflected by the PUF, is dependent upon manufacturing variations that occur during the manufacturing process. A PUF can be evaluated but is difficult to characterize. The physical structure can include a plurality of random components or factors that are determined or introduced during the manufacturing process, in this case, of IC 150. In general, when a physical stimulus, e.g., device code request 155, is applied to IC 150, a response in the form of device code 160, which is a PUF in this example, is output.

The unclonability property of a PUF refers to the high level of difficulty in constructing a PUF that has the same challenge response behavior as a selected PUF. In some cases, a PUF can utilize physical randomness that is explicitly introduced into a process or system. In other cases, a PUF can utilize randomness that is intrinsically present in a physical system such as the IC manufacturing process. Two PUFs that were manufactured as part of the same process will still possess a unique challenge-response behavior.

One example of a PUF can rely upon random variations in delays of wires and gates that arise in consequence of manufacturing variations. Given an input challenge, e.g., device code request 155, a race condition can be set up within device code circuitry 145. Two transitions can propagate along different paths. The signal propagation can be compared to see which path is first, or fastest. An arbiter within device code circuitry 145, typically implemented as a latch, can produce a one or a zero depending on which path is fastest. The PUF can be some function of the result, a function of a plurality of such results, or race conditions, or the like. When a circuit with the same layout mask is fabricated on different ICs, the PUF that is generated by each IC will differ and uniquely identify the IC due to the random variations of delays from one IC to another.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Another example of a PUF relies upon characteristics of the material used to implement circuitry. A static random access memory (SRAM), for example, can be used to generate a PUF. Each cell of the SRAM, when left uninitialized, will converge to a one or a zero each time power is applied. The values of the cells of the SRAM can be read out as a PUF. Alternatively, the PUF can be a function of the values read from the SRAM.

In any case, processor 105 can send a device code request 155 to device code circuitry 145. In response, device code circuitry 145 can send device code 160 to processor 105. In one or more embodiments, processor 105 can send a plurality of device code requests 155 to device code circuitry 145. In response to each device code request 155, device code circuitry 145 can send device code 160 to processor 105. Processor 105 can apply one or more processing techniques to received device code(s) 160. Results of the processing technique, as determined by processor 105, indicate whether IC 150 has been compromised.

As noted, data processing system 102 can issue several device code requests 155 and receive a device code 160 in response to each such request. Device codes 160 can be stored within memory elements 110 for analysis. In one or more embodiments, a measure of randomness can be determined or calculated from the plurality of device codes 160 stored in memory elements 110. The measure of randomness can be compared with a predetermined level of randomness. When the measure of randomness does not exceed the predetermined level of randomness, data processing system 102 can determine that IC 150, or some portion thereof, such as device code circuitry 145, has been compromised. When the measure of randomness exceeds the predetermined level of randomness, data processing system 102 can determine that IC 150 has not been compromised or is free of tampering.

It should be appreciated that data processing system 102 has been used for purposes of illustration within FIG. 1. Any of a variety of different processors capable of requesting device codes and processing device codes as described within this specification can be used. In one or more other embodiments, a processor can be used to perform the functions attributed to data processing system 102. The processor, for example, can be located within IC 150 and can be configured to communicate with device code circuitry 145. Further, the processor can execute program code instructions or can be implemented in the form of a circuit in which the functions are implemented purely using circuitry, e.g., where the processor is a hard circuit that executes little or no program code.

Figure 2:
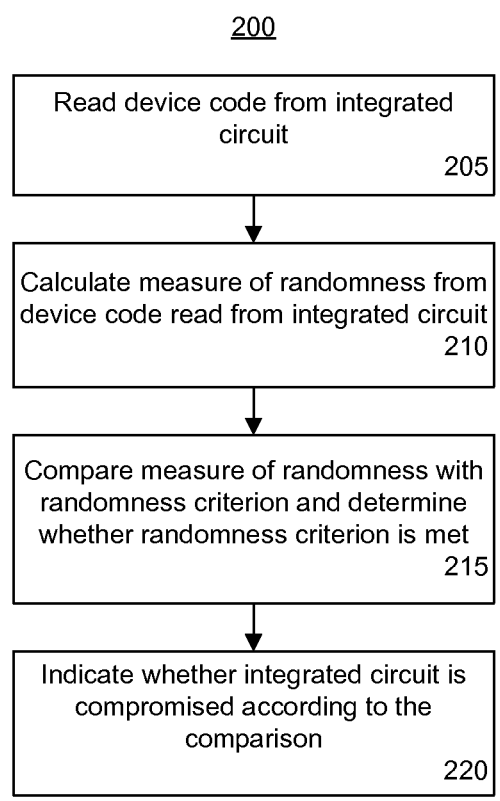
FIG. 2 is a first flow chart illustrating a method of evaluating device codes in accordance with one or more other embodiments disclosed within this specification.

FIG. 2 is a first flow chart illustrating a method 200 of evaluating device codes in accordance with one or more other embodiments disclosed within this specification. Method 200 can be performed using a system as described with reference to FIG. 1. In general, method 200 can be used to indicate whether an IC, or a portion of the IC, has been compromised in consequence of a deliberate attack or an accidental situation.

Method 200 can begin in step 205, where a device code can be read from an IC. The device code can include a plurality of different values, e.g., bits. For example, the device code can be large enough in number of bits to permit evaluation of the randomness of the bits that collectively form the device code. In step 210, from the device code read from the IC, a measure of randomness can be calculated. The measure of randomness can be determined from the plurality of values specified within or by the device code. Examples of measures of randomness can include, but are not limited to, statistical tests, transforms (e.g., Hadamard transform), complexity (e.g., where the more complex a data set, the more randomness is attributed to the data set), or combinations of the aforementioned measurement techniques.

In one example, a ratio of zeros and ones can be determined from the device code read from the IC. In the case where the device code is a randomly generated number, the device code will generally be formed of approximately 50% zeros and 50% ones. Likewise, a well designed PUF will have a substantially constant ratio of zeros and ones and further, at least with respect to a selected IC, exhibit randomness when one PUF is evaluated or a plurality of PUFs are evaluated as a group for the IC. In this regard, a device code can be read a plurality of times and the plurality of device codes read back from the IC can be evaluated for randomness. In another example, a statistical processing technique can be applied that provides an indication, e.g., a measure of randomness, that indicates whether the device code read from the IC is a randomly generated number.

In step 215, the measure of randomness can be compared with a randomness criterion to determine whether the randomness criterion has been met. When the randomness criterion is met, the system determines that the IC, or a portion thereof, has not been compromised. When the randomness criterion has not been met, the system determines that the IC, or a portion thereof, has been compromised, e.g., tampered with.

Continuing with the example discussed in step 210, the ratio of ones to zeros, or zeros to ones as the case may be, can be compared with the randomness criterion. In one example, the randomness criterion can be a predetermined level of randomness that also can be expressed as a ratio. In some cases, the ratio of ones to zeros, or zeros to ones, may not be 50%, but rather some other percentage. The measure of randomness can be compared with the percentage specified by the randomness criterion. The measure of randomness, for example, must exceed the level specified by the randomness criterion for the randomness criterion to be met. In one or more embodiments, the randomness criterion can be expressed as a range, e.g., 45%-55%. In that case, the measure of randomness must fall within the range specified by the randomness criterion in order for the randomness criterion to be met.

In step 220, the system can indicate whether the IC has been compromised according to the comparison performed in step 215.

Figure 3:
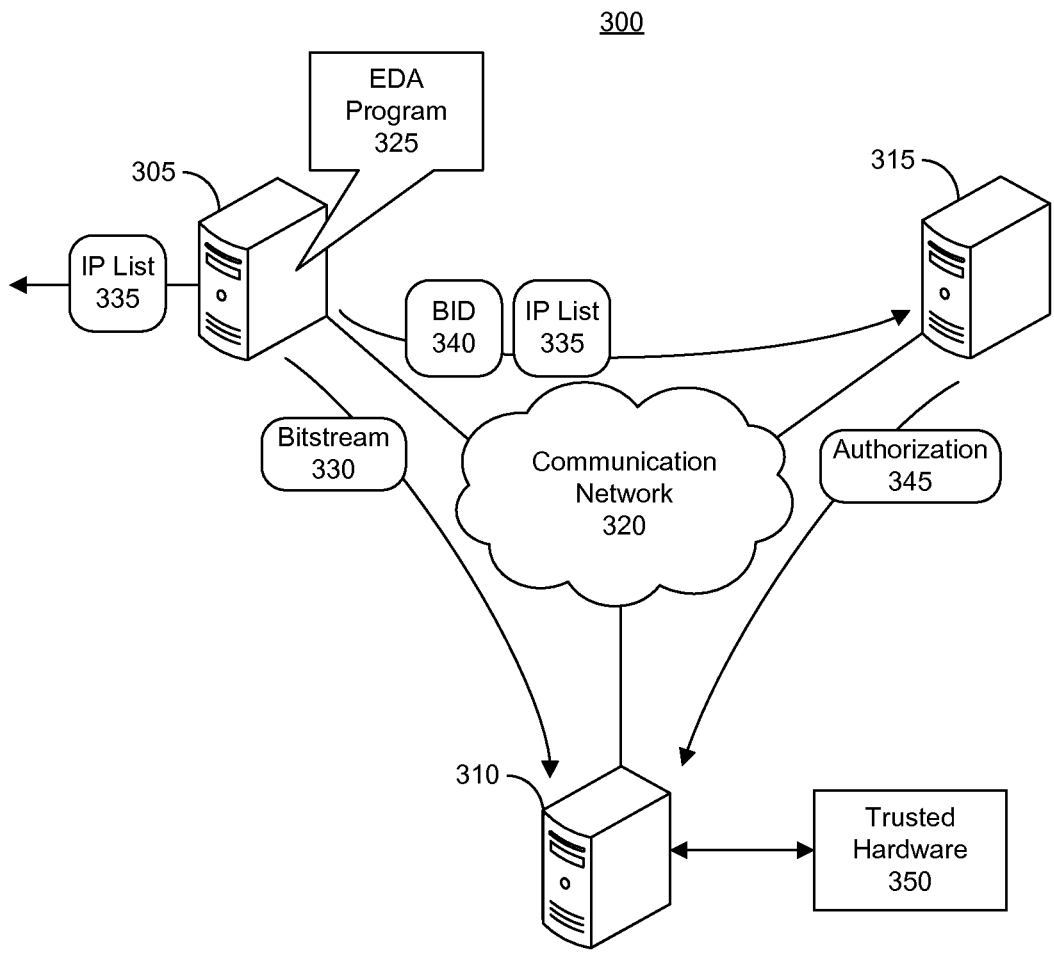
FIG. 3 is a second block diagram illustrating a system for tracking intellectual property (IP) core usage in accordance with one or more other embodiments disclosed within this specification.

FIG. 3 is a second block diagram illustrating a system for tracking IP core usage in accordance with one or more other embodiments disclosed within this specification. FIG. 3 illustrates an exemplary system 300 that can be used to track usage of controlled IP cores within circuit designs.

FIG. 3 illustrates three separate and independent computing systems shown as systems 305, 310, and 315. System 305, also referred to as the first system, can belong to a first party that performs circuit design. The term "party" can refer to an organization, an entity, or the like formed of one or more persons. The first party can be referred to as the "circuit designer." System 310, also referred to as the second system, can belong to a second party that is independent of the first party. For example, computer system 310 can belong to a contract manufacturer that implements or loads circuit designs developed by the circuit designer into ICs. System 315, also referred to as the third system, can belong to a third party, e.g., a trusted third party, that is separate and independent of both the first party and the second party.

In one or more embodiments, each of systems 305, 310, and 315 can be implemented as computer systems as described with reference to FIG. 1. For example, one or more or all of systems 305-315 can be implemented in the form of a server or a workstation. Each of systems 305-315 can be coupled together or communicatively linked, via a communication network such as the Internet, private networks, whether wired or wireless, or any combination thereof.

The circuit designer can create a programmatic circuit design using an electronic design automation (EDA) program 325 executing in system 305. The circuit design created by the circuit designer can use one or more controlled IP cores. As used within this specification, the phrase "controlled IP core" can refer to an IP core that is restricted in terms of its usage in some way. For example, the circuit designer must acquire the right, typically through payment, to utilize the controlled IP core from the IP core providers (not shown). Typically, acquisition of rights to use the controlled IP core is limited in that the controlled IP core can be used a limited number of times in a single IC as well as across multiple ICs. For example, payment facilitating use of a controlled IP core can be predicated upon the number of instances of the controlled IP core implemented within ICs.

When the circuit design is complete, e.g., responsive to generation of a bitstream 330 specifying the circuit design, an IP list 335 can be generated by system 305. IP list 335 can specify each particular controlled IP core utilized in the circuit design. IP list 335 further can specify the number of instances of each controlled IP core within the circuit design, e.g., the number of times each individual controlled IP core is used within the circuit design and, therefore, specified by bitstream 330.

When bitstream 330 is generated within system 305, a bitstream identifier (BID) 340 can be generated and included within bitstream 330. In one or more embodiments, BID 340 can uniquely identify bitstream 330. For example, BID 340 can be the message authentication code (MAC) of bitstream 330. BID 340 can be included within the authentication hash of bitstream 330 thereby preventing removal of BID 340 from bitstream 330 to ensure authentication and prevent tampering.

As pictured in the example shown in FIG. 3, one copy of IP list 335 can be output so as to be available to the circuit designer. As used herein, "outputting" and/or "output" can mean, for example, writing to a file, writing to a user display or other output device, storing in memory, sending or transmitting to another system, exporting, or the like. A second copy of IP list 335 can be provided or sent to system 315 of the trusted third party. BID 340 also can be sent from system 305 to system 315. Within system 315, BID 340 can be associated or otherwise correlated with IP list 335. For example, system 315 can create a record within a data structure such as a database that can be stored within system 315. The record can specify the association between BID 340 and IP list 335.

As noted, BID 340 can be correlated or associated with IP list 335. In this regard, BID 340 can be said to specify IP list 335. In one or more other embodiments, however, BID 340 can more directly specify IP list 335. For example, the particular IP cores and/or the number of instances of each IP core on IP list 335 can be obtained or decoded from BID 340.

In one or more embodiments, system 315 can generate an authorization 345 that can be provided to system 310. Authorization 345 can specify, for example, the number of ICs that the contract manufacturer is allowed to create. Authorization 345 further can specify BID 340. The number of ICs that the contract manufacturer is allowed to create can be correlated with the number of bitstreams 330 (or copies of bitstream 330) loaded into ICs. When the trusted third party, e.g., system 315, sends authorization 345 to system 310, it should be appreciated that system 305 will have sent to system 315 a request to authorize a particular number of copies of bitstream 330 to be loaded into ICs by the contract manufacturer. The request specifying the number copies of bitstream 330 to be authorized can be provided with IP list 335 and BID 340. Authorization 345, specifying the requested number of authorized copies of bitstream 330, can be stored and associated with IP list 335 and BID 340.

In one or more embodiments in which system 315 provides authorization 345 to system 310, authorization 345 can be received within trusted hardware 350 that is coupled to system 310. Trusted hardware 350, for example, can be operated by, or be under the control of, the trusted third party, despite being located on premises or being coupled to system 310 of the contract manufacturer. Trusted hardware 350 can track the number of copies of bitstream 330 that are loaded into ICs for purposes of accounting and tracking usage of controlled IP cores. For example, trusted hardware 350 can be coupled to an IC programming device. Trusted hardware 350 can track the number of copies of bitstream 330 loaded into ICs and can, in some cases, disable the IC programmer when a specified count is reached. Accordingly, through trusted hardware 350, the contract manufacturer is not permitted to load more copies of bitstream 330 into ICs than specified by authorization 345. Still, trusted hardware 350 maintains a count of the number of copies of bitstream 330 loaded into ICs, e.g., where the count is less than that specified by authorization 345.

In one or more other embodiments, where no authorization 345 is provided from system 315 to system 310, system 310 can track the number of copies of bitstream 330 that are loaded into ICs. In that case, there may not be any upper limit for the number of copies of bitstream 330 that can be loaded into ICs so long as an accounting, e.g., a count, is maintained. Further description regarding the process of loading bitstreams into ICs in accordance with the inventive arrangements disclosed within this specification is provided with reference to FIG. 4.

FIG. 3 is illustrated where the transactions can take place over a communication network. It should be appreciated, however, that one or more or all of the various transactions described can be manually performed, e.g., via hand delivery, by mail, via a courier, or the like from one party to another. Accordingly, the different transactions described and further illustrated with respect to FIG. 4 can be performed entirely electronically, entirely manually, or using some combination of both electronic and manual delivery mechanisms.

Figure 4:
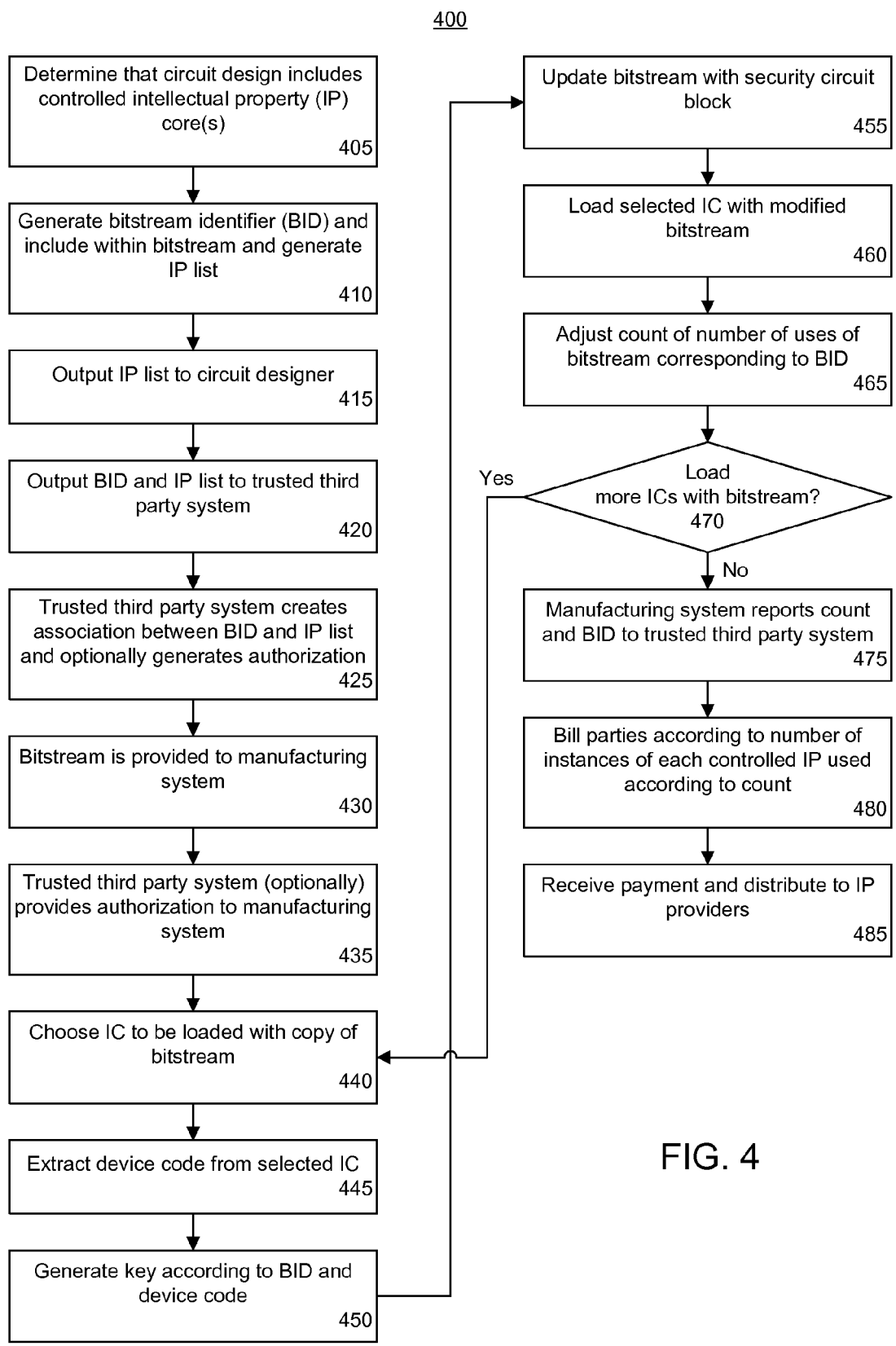
FIG. 4 is a second flow chart illustrating a method of tracking IP core usage in accordance with one or more other embodiments disclosed within this specification.

FIG. 4 is a second flow chart illustrating a method 400 of tracking IP core usage in accordance with one or more other embodiments disclosed within this specification. Method 400 can be implemented using a system largely as described with reference to FIG. 3. Accordingly, method 400 can begin in step 405 where a circuit design system determines that the circuit design being implemented includes one or more controlled IP cores. In step 410, the circuit design system can generate a BID and include the BID within a bitstream that is generated to specify the circuit design. The circuit design system also can generate an IP list. The IP list can specify each controlled IP core used within the circuit design as well as the number of instances of each controlled IP core used within the circuit design.

In step 415, the circuit design system can output or otherwise report the IP list to the circuit designer. It should be appreciated that while step 415 is described as a reporting step subsequent to bitstream generation, in one or more other embodiments, the number of controlled IP cores and number of instances of each such controlled IP core can be made available to the circuit designer at any of a variety of times during development of the circuit design, e.g., responsive to a user request submitted through the EDA program executing in the circuit design system.

In step 420, the circuit design system can output the BID and the IP list to a trusted third party system belonging to the trusted third party. In step 425, the trusted third party system can create an association between the BID and the IP list. As noted, the trusted third party system optionally can generate an authorization specifying an upper limit on the number of ICs within which the bitstream can be loaded. In step 430, the circuit design system can provide the bitstream to a manufacturing system belonging, for example, to the contract manufacturer. In step 435, the trusted third party system optionally can provide the authorization to the manufacturing system.

In step 440, the manufacturing system can choose an IC as the selected IC within which a copy of the bitstream is to be loaded. In step 445, the manufacturing system can extract, e.g., read, the device code from the selected IC. As discussed, the device code can uniquely identify the selected IC from which the device code is extracted from a plurality of like or same types of ICs. In one or more embodiments, the device code can be analyzed as described with reference to FIGS. 1 and 2 to determine whether the selected IC has been compromised in some way. For example, the device code can be a serial number or a PUF. Thus, the device code can be extracted one or more different times and processed using the techniques described, whether by the manufacturing system or a processor internal to the selected IC.

In step 450, the manufacturing system can generate a key that can be used to unlock one or more or all of the controlled IP cores when instantiated within the selected IC. The key that is generated can be a function of both the BID and the device code that is extracted from the selected IC. By making the key dependent upon the BID, the key can be used only for the particular bitstream that is being loaded as provided from the circuit design system. By making the key dependent upon the device code, the key becomes unique and usable only for the selected IC. Accordingly, were the key to be provided to a different physical IC than the selected IC, albeit an identical model as the selected IC, the key would not unlock the controlled IP cores loaded therein.

In step 455, the manufacturing system can update the bitstream to specify a security circuit block for comparison of the key. More particularly, the manufacturing system can generate a bitstream, or a portion thereof, that specifies a security circuit block that can compare a received key with an internally stored and/or generated key. The security circuit block is inserted into the bitstream, resulting in a modified bitstream. Once loaded into the selected IC, the security circuit block can compare a key provided to the selected IC with an internal key, for example, upon startup of the IC. The internal key can be stored within the security circuit block, e.g., within a register or a secured register, or can be generated internally within the security circuit block using a same or similar process as described in step 450.

In step 460, the selected IC can be loaded with the modified bitstream. In step 465, the manufacturing system can adjust the count that specifies the number of copies of the bitstream that have been loaded into an IC. The count that is maintained can be correlated with the BID. For example, when a copy of the bitstream is successfully loaded into the selected IC, the count can be incremented by one.

In step 470, a determination can be made by the manufacturing system whether more ICs are to be loaded with the bitstream, or a copy thereof. When more ICs are to be loaded, method 400 can loop back to step 440 to choose a next IC to be the selected IC. The process can continue. When no further ICs are to be loaded, method 400 can proceed to step 475.

In step 475, the manufacturing system can report the count and the associated BID to the trusted third party system. In step 480, the trusted third party can submit an invoice to the circuit designer. For example, the trusted third party can submit an electronic invoice to the circuit design system. The electronic invoice can reflect the cost of utilizing each of the controlled IP cores specified on the IP list. The cost reflected in the invoice is dependent upon the count. Thus, the invoice reflects the total cost of utilizing the controlled IP cores based upon the number of instances of each controlled IP core within the bitstream, the number of ICs created using the bitstream, and the unit cost established by each respective IP core provider for their controlled IP core(s). It should be appreciated that the controlled IP cores on the IP list can be from one or more different IP core providers.

In step 485, responsive to receiving payment from the circuit designer, the trusted third party can distribute funds to each IP core provider in the correct amount, e.g., as determined according to the number of instances of each controlled IP core used and the cost established for use of the controlled IP core by each respective IP core provider. In one or more other embodiments, the circuit designer can submit payment directly to each of the various IP core providers.

Figure 5:
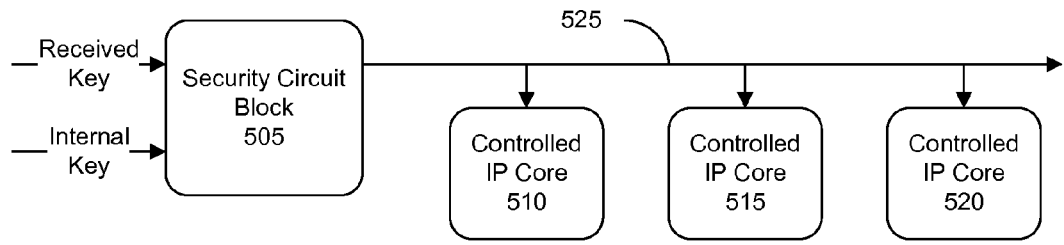
FIG. 5 is a third block diagram illustrating a security architecture in accordance with one or more other embodiments disclosed within this specification.

FIG. 5 is a third block diagram illustrating a security architecture 500 in accordance with one or more other embodiments disclosed within this specification. Security architecture 500 can be implemented within an IC responsive to loading a modified bitstream as described with reference to FIG. 4. In the example illustrated in FIG. 5, security circuit block 505 can provide the necessary unlock code to unlock each of controlled IP cores 510, 515, and 520 over a permission bus 525. As described with reference to FIG. 4, security circuit block 505 can compare a received key with an internal key. In one or more other embodiments, and as shown in FIG. 5, security circuit block 505 can compare the received key with an internally stored key. The internally stored key can be prestored within the IC or can be generated dynamically within the IC. Since the key is a function of the BID and the device code, e.g., a PUF, security circuit block 505 can compare the received key with the internal key and determine whether the two keys match. When a match exists, an unlock code can be broadcast on permission bus 525 simultaneously to each of controlled IP cores 510-520.

Within security architecture 500, a same security circuit block from one bitstream to the next can be used since each controlled IP core is coupled to permission bus 525. The number of outputs needed by security circuit block 505 to send unlock codes to controlled IP cores remains constant. Though the implementation of security circuit block 505 can remain constant from one circuit design to the next, each of controlled IP cores 510-520 are enabled or disabled as a group. Controlled IP cores 510-520 cannot be individually enabled or disabled.

In one or more other embodiments, however, permission bus 525 can include signals for conveying addressing information that can be recognized by IP cores. Accordingly, using an addressing system as described where each IP core is assigned a unique address, each of IP cores 510-520 can be enabled and/or disabled independently of one another.

Figure 6:
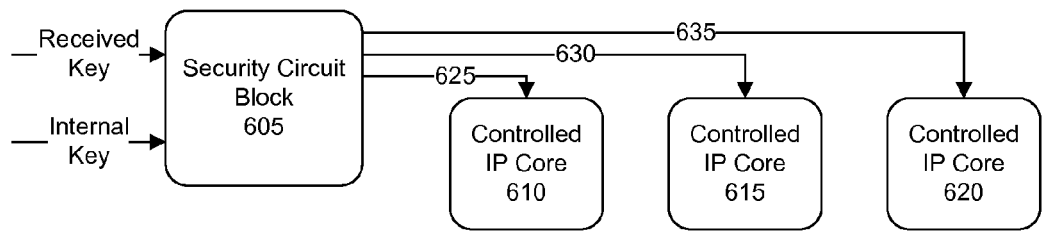
FIG. 6 is a fourth block diagram illustrating a security architecture in accordance with one or more embodiments other disclosed within this specification.

FIG. 6 is a fourth block diagram illustrating a security architecture 600 in accordance with one or more other embodiments disclosed within this specification. Within security architecture 600, each of controlled IP cores 610-620 can be individually unlocked by security circuit block 605 via respective signals 625-635. Within the example shown in FIG. 6, security circuit block 605 must be customized for each different bitstream based upon the number of different controlled IP cores to be enabled since each is coupled to security circuit block 605 by a different signal. Further, each of controlled IP cores 610-620 can be individually enabled or disabled via the dedicated signal 625-635.

Figure 7:
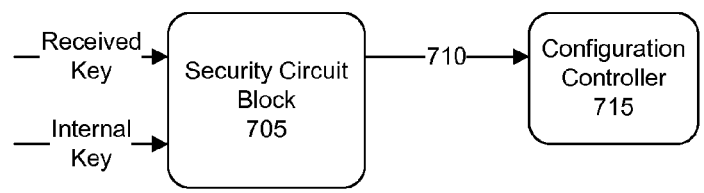
FIG. 7 is a fifth block diagram illustrating a security architecture in accordance with one or more other embodiments disclosed within this specification.

FIG. 7 is a fifth block diagram illustrating a security architecture 700 in accordance with one or more other embodiments disclosed within this specification. Within security architecture 700, rather than unlocking controlled IP cores, security circuit block 705 can be configured to send a control signal 710 to a configuration controller 715. In one or more embodiments, configuration controller 715 can be implemented as, or be part of, an Internal Configuration Access Port (ICAP) of the IC within which architecture 700 is implemented. When security circuit block 705 determines that the key matches the internal key, for example, security circuit block 705 can allow operation of the IC to continue as normal. When a mismatch occurs, however, security circuit block 705, via control signal 710, can instruct configuration controller 715 to erase one or more or all portions of configuration memory of the IC that stores the modified bitstream.

Configuration controller 715 can load configuration data into configuration memory of the IC within which architecture 700 is implemented thereby instantiating or forming circuitry from the programmable circuitry contained therein. Similarly, configuration controller 715 can selectively delete, e.g., overwrite, portions of configuration memory thereby effectively dismantling circuitry within the IC.

In one or more embodiments, security circuit block 705 can instruct configuration controller 715 to erase the entirety of the configuration memory resulting in the entire circuit design being erased from the IC and the IC itself being disabled. In one or more other embodiments, security circuit block 705 can instruct configuration controller 715 to erase only selected portions of configuration memory. For example, security circuit block 705 can instruct configuration controller 715 to erase particular cores, such as the controlled IP cores, from configuration memory. In embodiments such as these, the controlled IP cores can be configured so that no enablement code is required. Alternatively, an enablement code can be provided to each controlled IP core by default, though such a code need not be provided by security circuit block 705.

In one or more other embodiments, when a mismatch occurs, security circuit block 705 can instruct configuration controller 715 to write a failure code into a status register corresponding to a controlled IP core. For example, the status register can be a look-up table type of random access memory. In cases where failure codes are written to the status register(s) of controlled IP core(s), however, security circuit block 705 must be configured with knowledge of the location of the status register for each controlled IP core in the circuit design or for which a failure code may be desired.

While FIG. 7 is described as being implemented in the form of a circuit block within the IC being configured, in one or more other embodiments, the security circuit block can be implemented in the form of a process executed within a computer system coupled to the IC. In one example, the computer system can read the device code from the IC. The BID can be read from the IC or can be obtained from another source. Accordingly, the computer system can generate the key to be compared with a received key. In another example, the computer system can read the internal key from the IC and compare the internal key with a received key. When a mismatch occurs, the computer system can generate an interrupt that can be provided to the IC to invoke the security process implemented by the configuration controller to erase one or more or all portions of the configuration memory.

Figure 8:
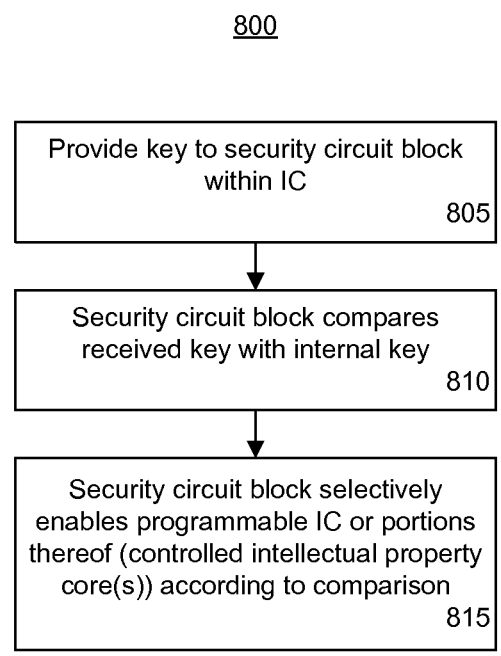
FIG. 8 is a third flow chart illustrating a method of selectively enabling portions of a programmable integrated circuit in accordance with one or more other embodiments disclosed within this specification.

FIG. 8 is a third flow chart illustrating a method 800 of selectively enabling portions of a programmable IC in accordance with one or more other embodiments disclosed within this specification. Method 800 can be implemented by a programmable IC as described with reference to FIGS. 5-7 of this specification. Method 800 can begin in a state where a programmable IC has been loaded with a bitstream that specifies one or more controlled IP cores and a security block as described with reference to FIG. 5, 6, or 7. The programmable IC can be started or booted with the circuit design loaded therein.

Accordingly, method 800 can begin in step 805 where the key can be received by the IC. More particularly, the key can be received by the security circuit block within the IC. In step 810, the security circuit block can compare the received key with an internal key. In step 815, the security circuit block can selectively enable the controlled IP cores according to whether the received key matches the internally stored or generated key. When the received key matches the internal key, the controlled IP cores can be enabled. When the received key does not match the internal key, the controlled IP cores and/or the IC itself can be disabled.

The one or more embodiments disclosed within this specification provide various techniques for the detection of tampering and/or to determine when an IC, or a portion thereof, has been compromised. Further, usage of controlled IP cores can be tracked to facilitate licensing and payment to providers of controlled IP cores. Security architectures that facilitate enablement and/or disablement of the controlled IP cores and/or the IC itself also are provided.

The flowcharts in the figures illustrate the architecture, functionality, and operation of possible implementations of systems, methods and computer program products according to one or more embodiments disclosed within this specification. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a computer-usable or computer-readable medium, storing program code that, when loaded and executed in a system as disclosed within this specification, causes the system to perform at least a portion of the functions described herein. In another example, a data storage medium can include program code, e.g., a bitstream, that when loaded into a programmable IC causes a circuit design, e.g., circuitry, to be instantiated, implemented, or formed within the programmable IC. Examples of data storage media that are non-transitory in nature can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of intellectual property protection, the method comprising:
   using a processor, creating a bitstream identifier within a bitstream specifying a circuit design, wherein the bitstream identifier is associated with a list of controlled intellectual property cores;
   reading a device code from an integrated circuit prior to loading the bitstream into the integrated circuit;
   generating a key from the bitstream identifier and the device code;
   modifying the bitstream to specify a security circuit block configured to compare the key to an internal key subsequent to loading the modified bitstream into the integrated circuit; and
   loading the modified bitstream into the integrated circuit.

2. The method of claim 1, wherein the
   security circuit block is configured to selectively enable each controlled intellectual property core responsive to comparing the key to the internal key subsequent to loading the modified bitstream into the integrated circuit.

3. The method of claim 2, further comprising:
   providing the key to the integrated circuit.

4. The method of claim 1, further comprising:
   determining a count specifying a number of integrated circuits loaded with the bitstream;
   determining usage of each controlled intellectual property core on the list according to the count and the list of controlled intellectual property cores using the bitstream identifier; and
   billing a creator of the bitstream according to usage of each controlled intellectual property core on the list.

5. The method of claim 4, further comprising:
   responsive to receiving payment, distributing at least a portion of the payment to a provider of each controlled intellectual property core on the list.

6. The method of claim 1, further comprising:
   calculating a measure of randomness from a plurality of values specified within the device code;
   comparing the measure of randomness to a randomness criterion; and determining whether the particular integrated circuit is compromised according to the comparison.

7. The method of claim 6, further comprising:
selecting the device code to be a randomly generated number.

8. The method of claim 6, further comprising:
selecting the device code to be a physically unclonable function (PUF).

9. The method of claim 1, wherein the
security circuit block is configured to erase selected portions of configuration memory of the integrated circuit responsive to comparing the key with the internal key subsequent to loading the modified bitstream into the integrated circuit.

10. An intellectual property protection system, comprising:
a first system configured to generate a circuit design, wherein the first system determines a list of controlled intellectual property cores within a bitstream specifying the circuit design, and creates a bitstream identifier within the bitstream;
a second system, coupled to the first system, configured to determine a count specifying a number of integrated circuits loaded with the bitstream; and
a third system, coupled to the second system, configured to determine usage of each controlled intellectual property core on the list according to the count and the list of controlled intellectual property cores using the bitstream identifier;
wherein the second system is further configured to:
for each integrated circuit in which the bitstream is to be loaded,
read a device code from the integrated circuit prior to loading the bitstream into the integrated circuit;
generate a key from the bitstream identifier and the device code;
modify the bitstream to specify a security circuit block configured to compare the key to an internal key subsequent to loading the modified bitstream into the integrated circuit; and
load the modified bitstream into the integrated circuit.

11. The intellectual property protection system of claim 10, wherein the
security circuit block is configured to selectively enable each controlled intellectual property core responsive to comparing the key to the internal key subsequent to loading the modified bitstream into the integrated circuit.

12. The intellectual property protection system of claim 10, wherein the second system is further configured to perform operations comprising:
calculating a measure of randomness from a plurality of values specified within the device code;
comparing the measure of randomness to a randomness criterion; and
determining whether the particular integrated circuit is compromised according to the comparison.

13. The intellectual property protection system of claim 12, wherein the device code is a randomly generated number.

14. The system of claim 12, wherein the device code is a physically unclonable function (PUF).

15. The intellectual property protection system of claim 10, wherein the
security circuit block is configured to erase selected portions of configuration memory of the integrated circuit responsive to comparing the key with the internal key subsequent to loading the modified bitstream into the integrated circuit.

* * * * *